United States Patent [19]

Tòth et al.

[11] Patent Number: 4,609,567
[45] Date of Patent: Sep. 2, 1986

[54] HIGH EFFICIENCY STABLE CDS-CU2S SOLAR CELLS MANUFACTURING PROCESS USING THICK FILM METHODOLOGY

[76] Inventors: Ottilia F. Tòth; Alexandre Kocsis, both of 1382 La Terrière, Sherbrooke, Quebec, Canada, J0K 2R2

[21] Appl. No.: 662,834

[22] Filed: Oct. 19, 1984

[30] Foreign Application Priority Data

Nov. 14, 1983 [CA] Canada .................................. 441,034

[51] Int. Cl.$^4$ .............................................. B05D 5/12
[52] U.S. Cl. ...................................... 427/74; 136/260; 427/87
[58] Field of Search ...................... 427/74, 87; 136/260

[56] References Cited

U.S. PATENT DOCUMENTS

| | | | |
|---|---|---|---|
| 3,520,732 | 7/1970 | Nakayama et al. | 136/260 |
| 4,251,286 | 2/1981 | Barnett | 136/260 |
| 4,318,938 | 3/1982 | Barnett et al. | 136/260 |
| 4,368,216 | 1/1983 | Manassen et al. | 427/74 |
| 4,403,398 | 9/1983 | Laurie et al. | 427/74 |
| 4,404,734 | 9/1983 | Singh | 427/74 |
| 4,411,703 | 10/1983 | Whitehouse | 427/74 |
| 4,463,215 | 7/1984 | Bassett et al. | 427/74 |
| 4,493,886 | 1/1985 | Lauks | 427/87 |
| 4,517,047 | 5/1985 | Chang et al. | 427/87 |
| 4,526,809 | 7/1985 | Hall et al. | 427/87 |

OTHER PUBLICATIONS

Matsumoto et al, Jap. Journ. Appl. Phys., vol. 19, No. 1, Jan. 1980, pp. 129–134.
Vodjani et al, Electronic Letters, vol. 9, No. 6, Mar. 1973, pp. 128,9.

Primary Examiner—John H. Newsome
Attorney, Agent, or Firm—Robic, Robic & Associates

[57] ABSTRACT

A process of manufacturing a high-efficiency, stable CdS-Cu2S solar cell using a thick film methodology, which process comprises the steps of: A—preparing a CdS slurry from a Cd-doped, CdS powder; B—depositing a 10-15$\mu$ thick layer of the CdS slurry onto a substrate plated with thin layers of Zn and Cd; C—drying the CdS layered substrate and subjecting it to heat treatment; D—pressing the heat-treated substrate; E—subjecting the pressed, CdS layered substrate to another heat treatment to cause CdS recrystallisation and annealing; F—forming a thin layer of $Cu_xS$ wherein the value of x is from 1.996 to 2, onto the surface of the heat-treated, CdS layered substrate under an inert atmosphere to produce a CdS-$Cu_xS$ layered assembly; G—subjecting the CdS-$Cu_xS$ layered assembly to heat treatment under a $H_2$ atmosphere in the presence of CaO; H—providing an upper conductor onto the upper surface of the heat treated assembly to complete the desired, stable CdS-Cu2S solar cell; and I—encapsulating the obtained cell. This process is advantageous in that it can be carried out with a very simple equipment and sequence of steps, thereby making the overall cost of the resulting solar cells, even when encapsulated with glass, advantageously comparable with the overall cost involved for the manufacture of the cheapest known silicon-based solar cells.

30 Claims, 3 Drawing Figures

HIGH EFFICIENCY STABLE CDS-CU2S SOLAR CELLS MANUFACTURING PROCESS USING THICK FILM METHODOLOGY

The present invention relates to an improved process for the manufacture of high efficiency stable II–VI class solar cells, especially CdS-Cu$_2$S solar cells, and to the solar cells obtained by such a process.

More particularly, the invention relates to a process using a thick film methodology for the manufacture of a high-efficiency, stable CdS-Cu$_2$S solar cell.

It is well known by those skilled in the development of II–VI semi-conductor solar cell structures that the cells must be protected against atmospheric agents such as moisture, and against ultra violet radiation, in order to be highly efficient and stable. To provide such a protection especially for the CdS-Cu$_2$S solar cells, use is made of encapsulating material that need to be highly waterproof and airproof, with good optical transmission and effective mechanical interval resistance. As presently recognized, only glass seems to be a good encapsulating material. However, glass is also known to be relatively more expensive to use with the known CdS-Cu$_2$S solar cells manufactured up to now according to the known thin film methodology, than with the various known, polycrystalline and amorphous silicon-based solar cells which do not require absolute hermeticity.

It is also well known by those skilled in this art that two other main problems encountered with the CdS-Cu$_2$S solar cells are their stability and reproducibility using standard processes of manufacture.

All these problems have resulted up to now in a greater development and popularity of the silicon-based solar cells which require only cheap encapsulation against atmospheric effects such as dust, abrasion, chemical pollution and the like, as compared with the stringent requirements for the encapsulation of the CdS-Cu$_2$S solar cells.

An object of the present invention is to provide a process of manufacturing II–VI class semi-conductor-based solar cells, which process can be carried out with a very simple equipment and sequence of steps, thereby making the overall cost of the resulting solar cells, even when encapsulated with glass, advantageously comparable with the overall cost involved for the manufacture of the cheapest known silicon-based solar cells.

Another object of the invention is to provide a process of manufacturing a high efficiency, stable CdS-Cu$_2$S solar cells using a thick film methodology, thereby making the application of the required layers of CdS and Cu$_2$S much more easier, cheaper and faster than when use is made of the conventional known manufacturing processes.

A further object of the invention is to provide an improved process for carrying out the post-treatment usually applied to the Cu$_2$S-CdS solar cells to improve their efficiency and stability, which improved process permits to eliminate most of the water moisture from the cells, which moisture forms an electrolyte which in use substantially reduce the life-span of the cells.

The process according for the invention for the manufacture of a high efficiency, stable CdS-Cu$_2$S solar cell using a thick film methodology, basically comprises the steps of:

A—preparing a CdS slurry from a Cd-doped, CdS powder;

B—depositing a 10–15$\mu$ thick layer of the CdS slurry onto a substrate plated with subsequent layers of Zn and Cd;

C—drying the CdS layered substrate and subjecting it to heat treatment;

D—pressing the heat-treated substrate;

E—subjecting the pressed, CdS layered substrate to another heat treatment to cause CdS recrystallisation and annealing;

F—forming a thin layer of Cu$_x$S where the value of x is from 1.996 to 2, onto the surface of the heat-treated, CdS layered substrate under an inert atmosphere to produce a CdS-Cu$_x$S layered assembly;

G—subjecting the CdS-Cu$_x$S layered assembly to heat treatment under a H$_2$ atmosphere in the presence of CaO;

H—providing an upper conductor onto the upper surface of the heat treated assembly to complete the desired, stable CdS-Cu$_2$S solar cell; and I—encapsulating the obtained cell.

Except for the initial treatment of the substrate, including its plating with a thin layer of Zn and, if desired, Cd, the entire manufacturing process must be carried out under a N$_2$ ambient atmosphere at normal atmospheric pressure, with a very simple equipment. This advantageously permits to carry out the entire process in four separated sections only, which sections can be constructed in such a way that the hermeticity of their interior spaces can be maintained with a minimum care. The handling of the simple equipment located into each section and the necessary maintenance of this equipment can be made by personnel wearing a simple plastic bag interconnected with an appropriate flexible plug-in air-hose with adequate air circulation and pressure.

Another very important advantage of the process according to the invention lies in that the deposition of the layers of CdS and Cu$_2$S and of the other intermediate layers may be carried out in a very easy, fast and cheap manner. This is a substantial improvement over the known prior art, wherein the same layers are conventionally deposited by evaporation. The thick film deposition used in the process according to the invention, which can be made by either screen-printing or doctor-blading carried out in a continuous manner, advantageously avoids the problems generally encountered with the known processes where the deposition of the layers is carried out by evaporation and where the vapour pressure required for the formation of Cd$_x$Zn$_y$S layer cannot be easily controlled. As is also well documented, the presence of such mono- or multi-layer of Cu$_2$O is essential to reduce or eliminate the recombinaison of the photon generated minority carriers, thereby greatly improving the efficiency of the solar cell. Moreover, it is known that such a Cu$_2$O layer acts as diffusion barrier against further oxygen penetration into the Cu$_x$S layer, thereby substantially increasing the life-span of the cells. Moreover, the process according to the invention does not require a lot of time and energy for charging, pumping, evaporating, taking out the finished substrates in and from one furnace and after cleaning them, charging, pumping, evaporing and taking them out again in and from another furnace.

A further substantial advantage of the process according to the invention lies in the way the cells are heat-treated under a H$_2$ atmosphere before their encapsulation to eliminate as much moisture as possible from their structure. As it is well documented, H$_2$O in the form of water acts as an electrolyte which reduces the life-span of the solar cells. According to the invention, this final treatment is carried out in the presence of CaO which, on one hand, eliminates any moisture present in the cells and, on the other hand, is partially transformed during the heat treatment process into CaS, while the released oxygen ensures the formation of the required monolayer or multilayers of $Cu_2O$ on the surface of the $Cu_xS$ structure.

As is also well documented, the presence of such mono or multi-layer of $Cu_2O$ is essential to reduce or eliminate the recombinaison of the photon generated minority carriers, thereby greatly improving the efficiency of the solar cell. Moreover, it is known that such a $Cu_2O$ layer acts as diffusion barrier against further oxygen penetration into the $Cu_xS$ layer, thereby substantially increasing the life-span of the cells.

Since this final heat treatment step can be carried out with any kind of $CdS-Cu_2S$ solar cells, the present invention also proposes an improved process of manufacturing a high efficiency, stable $CdS-Cu_2S$ solar cells of the type comprising the steps of depositing a CdS layer onto a substrate and subsequently forming $Cu_xS$ layer onto the surface of the CdS-layered substrate to produce the desired solar cells, which process is improved in that it further comprises the step of subjecting the so produced solar cells to heat-treatment at 150°–170° C. under a $H_2$ atmosphere for at least one period of 12 hours in the presence of previously desiccated CaO in a sufficient amount to absorb the sulphur from the carrier $H_2S$ gas generated during the heat treatment, to retain sulphur in the form of CaS and to trap any moisture present in the cell structure.

Another further substantial advantage of the process according to the invention lies in that the resulting $CdS-Cu_2S$ solar cells all comprise a relatively thick substrate that is made of a metallic material such Al or Cu, having an excellent heat conduction coefficient, contrary to the vitreous, relatively thick indirect gap III-VI class semi-conductor based cells. Which all comprise a very thin layer of contact metal deposited by evaporation or screening. This particular feature is essential since it advantageously permits to substantially improve the range of operation of the cells according to the invention by affording them to be efficiently cool by liquid circulation, thereby preventing their output power from decreasing when the temperature increases.

BRIEF DESCRIPTION OF DRAWING

The invention and its various advantages will be better understood with reference to the following non restrictive description of a preferred embodiment thereof, taken in connection with the accompanying drawings wherein FIGS. 1 to 3 all together show a diagrammatic flow chart of the process according to the invention.

DOPING OF CdS POWDER AND PREPARATION OF A CdS SLURRY (STEP A)

Figure 1:
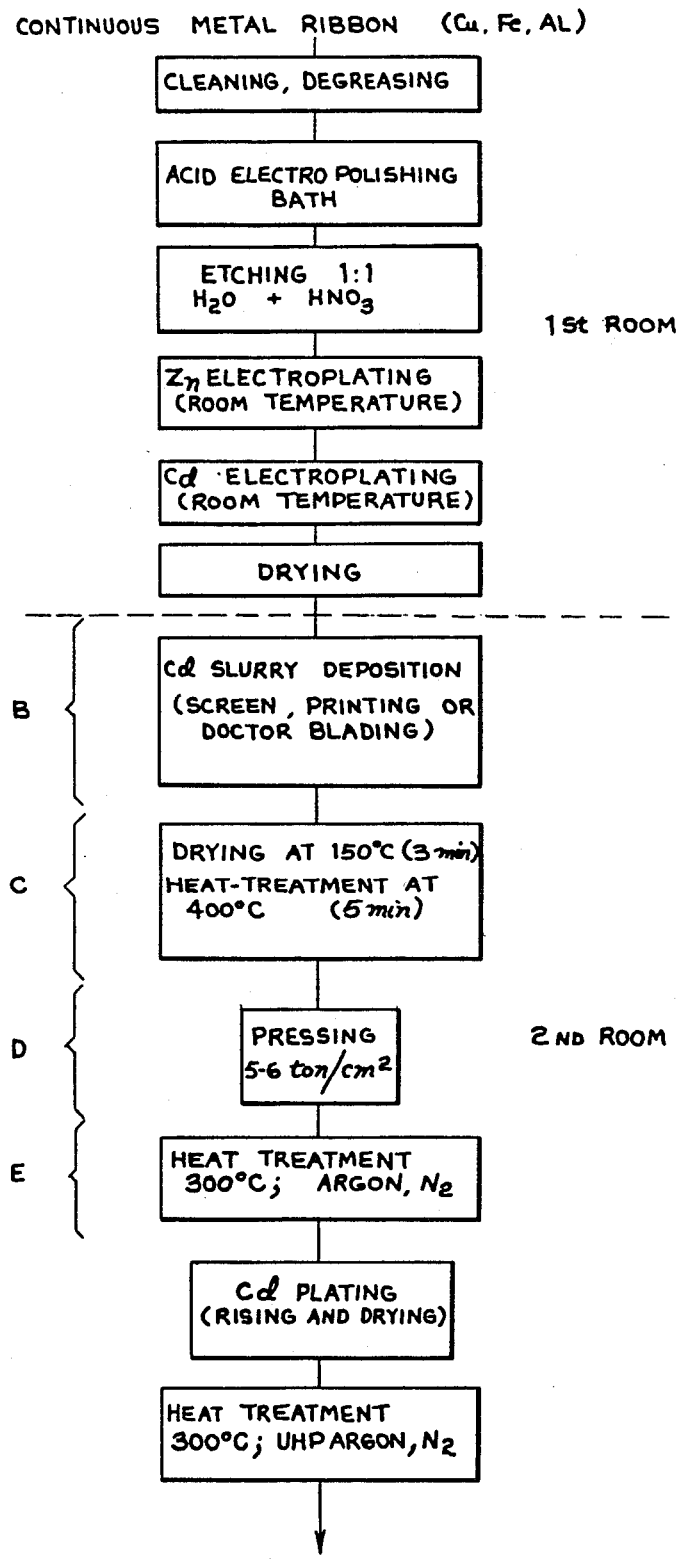
Figure 2:
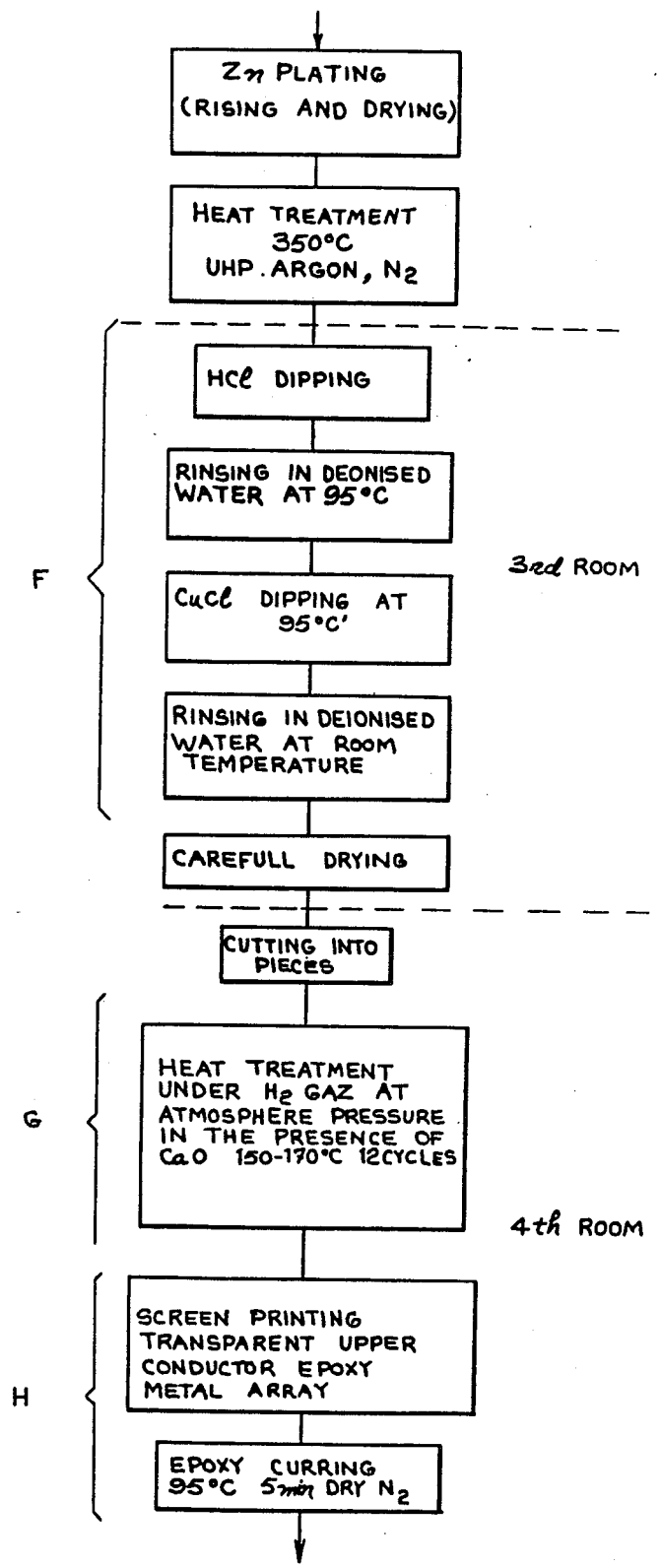
Figure 3:
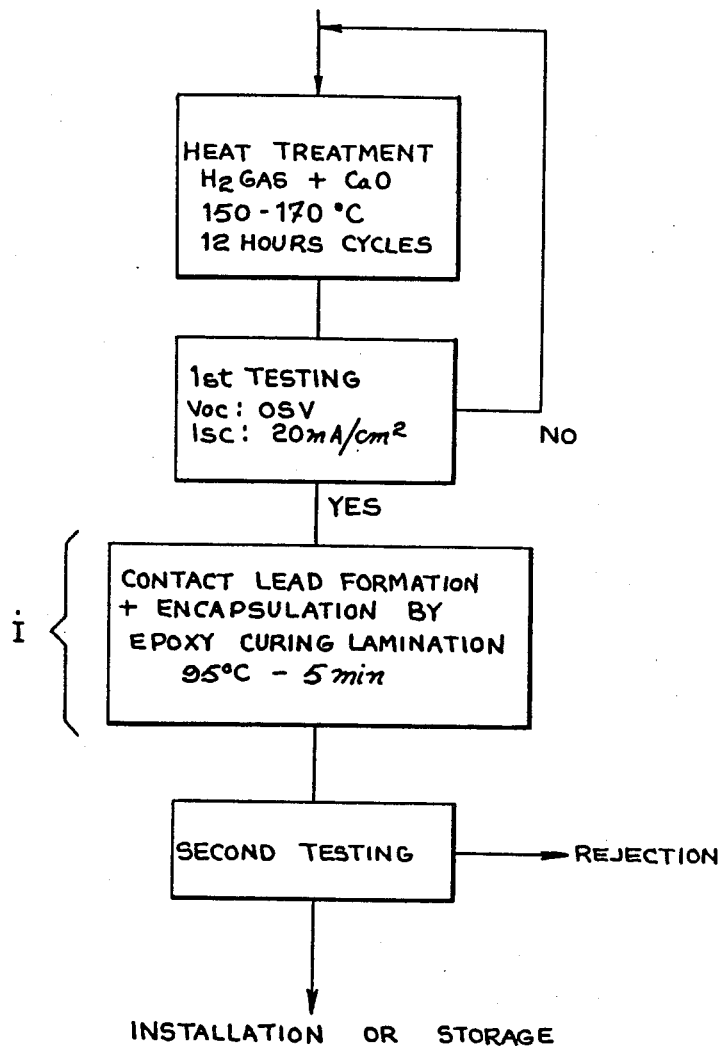

The first basic step of the process according to the invention consists in preparing a CdS slurry from a doped CdS powder. Since the photovoltaic conversion efficiency of a CdS-based solar cell depends mainly on the resistivity of the CdS, semi-conductor layer which must be ranging between 0.5 and 1 ohm per cm, it is usually necessary to properly dope the "electrical grade" CdS powder used as starting material (which has a minimal 76% Cd content) by cadmium diffusion to obtain the low resistivity required for a proper functioning of the cell. To do so, use can be made of a stainless steel furnace (Grieve Corp VI-3) containing six vertically stacked, aluminum trays. The electrical grade, CdS-powder as bought (from Alfa Ventron) is mixed with an equal amount of highly pure, microscopic cadmium particles that can be produced in the same furnace during doping of the previous batch, simply by placing Cd metal bars on the bottom of the furnace before starting the doping operation. Indeed, the 300° C. temperature used during the doping process causes the Cd metal bars to evaporate and the so evaporated Cd to deposit on the glass door of the furnace a thick layer of highly pure microscopic particles. The so deposited particles can be easily scraped into a container and filtered through a 200 mesh stainless steel screen to give cadmium particles having a maximum 74 micron size before its mixing in one to one weight ratio with the CdS powder.

The mixture of the CdS powdered and Cd particles are dispersed onto three trays in the form of 2-3 cm thick layers. On the remaining trays, high purity CaO particles (laboratory grade) are dispersed also in the form of 2-3 cm thick layers. The CaO and CdS containing trays are alternatively stacked over each other in the furnace, while taking care that the distance between two trays be of at least 5 cm, the first tray being situated at 10 cm from the bottom of the furnace.

As foresaid, at least 2 to 3 kilograms of cadmium metal bars can be placed on the bottom of the furnace in a shallow aluminum container covering the entire floor surface of said furnace, in order to prepare the pure Cd particles necessary for the next batch.

After all the trays have been charged into the furnace, the furnace door is closed hermetically and the temperature is switched on. In the meantime, a two stage mechanical pump is started to eliminate $N_2$ gas from the inside of the furnace ($N_2$ being advantageously used as ambient atmosphere during this doping step to prevent oxidation of the cadmium mixture).

After the maximum possible vacuum has been reached ($10^{-4}$ Torr practical), the furnace is filled up with ultra high purity (UHP) $H_2$ gas until normal atmospheric pressure is equalized. $H_2$ gas is eliminated after 10 minutes and the procedure is repeated as soon as the required temperature (300° C.) is reached.

By reducing the $H_2$ gas pressure a little bit, the process is continued for 30 to 40 minutes. Thereafter, the $H_2$ gas is evacuated and the furnace is filled up with UHP argon. After evacuation of the argon to the highest practical vacuum, the doping process is advantageously continued for a minimum of 100 hours. After this period of time, the temperature is shut down and the vacuum is equalized by filling up the furnace with the UHP argon. After cooling to the room temperature, the trays are withdrawn and the doped CdS powder is collected and filtered by using a 100 mesh stainless steel screen. The filtered powder can be stored in a glass jar for an indefinite period of time.

To prepare the CdS slurry as called for in step A of the process according to the invention, the CdS powder doped and filtered as described hereinabove, is mixed with an appropriate compound, preferably α-terpineol $[CH_3C_6H_8C(OH)(CH_3)_2]$. The amount of α-terpineol and/or the amount of CdS powder can be varied as desired to obtain the required viscosity for best deposition results. Once again, the so prepared slurry can be stored indefinitely.

It should be pointed out that the filtration of CdS powder referred to hereinabove at any desired particle size, advantageously permits to determine the size of the cristallites in the CdS layer of the future cell, which size is a determining factor in the conversion efficiency of the solar cell. This particular determination is specific to the process according to the invention, none of the known processes using vacuum evaporation, Rf-sputtering and spraying methodology, being capable of doing so.

PREPARATION OF THE SUBSTRATE AND DEPOSITION OF THE CdS SLURRY (STEP B)

The second basic step of the process according to the invention consists in depositing a 10-15 micron thick layer of the CdS slurry previously prepared onto a substrate plated with thin layers of Zn and Cd.

Advantageously, the substrate can be made of a metal selected from the group consisting of Cu, Fe and Al. If the process is intended to be carried out in a continuous manner, the substrate may be in a continuous ribbon form of desired thickness and width. Of course, the thickness and the width of the substrate can be selected as desired. During experiment carried out by the inventors, a copper ribbon substrate was used with thicknesses varying between 0.05 mm and 0.1 mm. The width of the copper ribbon was constant at 5.7 cm due to the size of the screen printing apparatus selected for the deposition of the slurry. As a matter of fact, the only factor related to the thickness of the substrate consists in the selection of the printing parameters, distance from the substrate from the screen, squeegee pressure and the like.

Of course, the metal substrate can be subjected to one or more pretreatments such as those referred to in the beginning of the accompanying flow chart, mainly a cleaning and degreasing treatment followed by a rinse cycle in deionized water at room temperature; an electro polishing treatment in an acid bath followed by the same rinse cycle; and an etching treatment in a $H_2O$, $HNO_3$ (1:1) bath also followed by the same rinse cycle as above. The so-pretreated substrate is subsequently electroplated with a 1-2 micron thick Zn layer upon which a 1-2 micron thick Cd metal layer is successively electroplated. The zinc and cadmium electroplating processes can be carried out at room temperature using standard high speed fluoro borate plating baths. Both the bath composition and its preparation are well known in the art and therefore will not be described in greater details hereinafter.

The substrate at the exit of the Zn electroplating bath and thereafter at the exit of the cadmium electroplating bath is of course subjected to rinse cycle in deionized water at room temperature. The rinsed substrate after having been cadmium plated is driven and fed directly to another room separate from the one where the treatment of the metal substrate is carried out. In this next room which is filled up with $N_2$ gas at atmospheric pressure under dried and monitored conditions with dust filtering for a minimum 0.05 micron size, the CdS slurry previously prepared is deposited onto the substrate.

The deposition of the CdS slurry can be carried out using a 50 mesh stainless steel screen with a polyurethane squeegee plate. This screen printing deposition permits to produce at least 50,000 cells with no adjustment, since, by using a adequate slurry viscosity, the squeegee pressure is negligeable without detectable wear.

Alternatively, the CdS slurry can be deposited by using a simple "doctor blading" process, wherein the dispersed CdS slurry is whipped off with a stainless steel blade held at a preselected distance from the surface of the moving ribbon substrate.

Satisfactory experiments were carried out by the inventors, using a AMI 855 screen printing machine fully automatized for high speed operation.

The "wet" thickness of the deposited CdS slurry needs to be selected experimentally according to the manufacturer's requirements. The final thickness of the CdS layer after the required treatments, must be of 10 to 15 microns.

As aforesaid, the $N_2$ atmosphere during the deposition process must also be filtered against dust particles using a 0.05 micron filter. The printing itself can be done under normal atmosphere, but, for sake of uniformity, an ambient $N_2$ atmosphere is recommended.

DRYING AND HEAT TREATMENT OF THE CdS LAYER SUBSTRATE (STEP C)

The continuous ribbon substrate covered with an experimentally preselected, thick layer of CdS slurry (usually 100-150 microns wet thickness) needs to be dried and heat-treated before being further processed. This drying and heat treatment can be carried out in a single belt furnace where drying is advantageously carried out at 150° C. for 3 minutes and heat-treatment is carried out at 400° C. for 5 minutes, by establishing a preselected temperature profile.

PRESSING (STEP D)

The fourth step of the process according to the invention is a pressing step. The heat-treated continuous ribbon substrate is pressed preferably between two chromium plated high strength steel plate under a momentary 5-6 metric tons/cm$^2$ pressure. Of course, the pressing equipment must be selected according to the width of the ribbon material. Since the travelling distance between the adjacent surfaces of the pressure steel plate is merely of a maximum of 2 mm, the structure of this pressure equipment and its energy requirement are very inexpensive. Actually, the only important condition is that the two opposite surfaces of the pressure plates be polished to at least one micron. During experiments carried out by the inventors, a polishing made onto the surfaces of the pressure plates lasted for more than 3 consecutive years with no maintenance. It appeared that the CdS layer and the substrate did not cause any damage to the hard chromium steel plates of the press.

HEAT TREATMENT OF THE PRESSED CdS LAYERED SUBSTRATE (STEP E)

The fifth basic step of the process according to the invention consists in subjecting the pressed CdS-layered substrate to heat treatment in an appropriate furnace. This heat treatment can be carried out in a box furnace provided that the CdS layer substrate be previously cut into pieces, or in a properly designed belt furnace. In both cases, the pressed CdS-layered substrate must be heated to 300° C. under an inert atmosphere for one to two hours to provide for recrystallization of CdS.

When use is made of a box furnace, this furnace can be a stainless steel box furnace similar to the one already used for the doping process. During the heat-treatment, the CdS-layer can be doped with cadmium. In practice, the pressed substrate is first cut to the desired length (usually 50 cm to 1 m sections, according to the furnace size). The pressed, CdS-layered substrate is then laid onto properly placed trays in the furnace. Many thousands meters of cells can be placed into one furnace, provided that they are tightly packed and separated by 2-3 mm using appropriate substrate holders. Prior to closing the furnace, a 1-2 kg cadmium metal bar can be placed in a shallow aluminum container on the floor of the furnace. After the furnace is closed, the $N_2$ ambient atmosphere is pumped out and replaced by UHP argon. The temperature is switched on until the required 300° C. temperature is reached. Then, the argon atmosphere is pumped out. The Cd-doping must be carried out for a minimum of 24 hours, during which the required recrystallization is also carried out and completed. The heat-treated, CdS-layered substrate may then be withdrawn and directed to the next step.

When use is made of a belt furnace, the CdS-layered substrate can only be doped with an experimentally determined layer of cadmium metal applied to by using an electroplating bath. Electroplating can be carried out for 10 to 20 seconds under a 0.1 Amp/cm$^3$ current density at room temperature in a fluoroborate bath such as the one used for the above mentioned Cd plating, until a 0.05-0.10 micron thick layer of Cd is deposited over the surface of the CdS layer. After successive rinsing in deionized water, the ribbon is heated for 5 to 15 minutes depending on the temperature selected, under an inert atmosphere consisting of $N_2$ or UHP argon. This heat-treatment can be carried out at temperatures ranging between 300°-700° C.

In both cases, a short heat-treatment is necessary to improve the Cd diffusion. In both cases too, the process can be advantageously completed by deposition of a covering, 0.3-0.4 micron thick layer of Zn. This Zn deposition should be followed by another heat treatment under inert atmosphere either in box furnace or by using a belt furnace.

The deposition of such a Zn layer can be carried out by electroplating, using the same fluoroborate bath as used previously for plating the ribbon substrate with Zn. The duration of the Zn plating can be experimentally determined, but usually it ranges between 10 to 20 seconds under a 0.1 Amp/cm$^2$ current density.

After rinsing in deionized water, the Zn-plated, layered substrate must be dried and reintroduced either into the box furnace or into the belt furnace for another heat-treatment. When a belt furnace is used, this additional heat-treatment can be carried out for 5 to 15 minutes at 500°-700° C. under normal atmospheric pressure in $N_2$ or Argon ambient. When use is made of a box furnace, the heat-treatment can be carried out for 1-2 hours at 500° to 700° C., using the same procedure as above. As soon as the temperature has been switched on, the $N_2$ atmosphere is replaced with UHP argon. After a while (5 to 10 minutes), argon is evacuated. When 350° temperature is reached, the furnace is refilled with argon.

The belt furnace and plating method and the box furnace and plating method can be equally used. The selection of one method instead of another only depends on the required automatization degree of the process.

The purpose of depositing two successive layers of cadmium and zinc onto the CdS layer prior to applying the thin $Cu_2S$ layer is to reduce as much as possible the crystallographic "mismatch" which occurs at the junction between both layers, which mismatch lessens considerably the minority carrier diffusion, thereby causing substantial reduction of both the short circuit current (Isc) on the opened circuit voltage (Voc) of the resulting cell. It is well known by those skilled in the art that, by using a semi conductor compound such as $Cd_x Zn_y S$ (x being around 0.85, y being around 0.15), the above mentioned mismatch can be eliminated, thereby improving considerably the overall efficiency of the resulting cell. It is well known too that the incorporation of Zn to CdS during the evaporation or sputtering resulting in a more or less homogenous $Cd_x Zn_y S$ layer, gives two undesirable effects. Firstly, Zn increases the cell series resistivity, which counterbalances the benefit resulting from the improved crystallographic matching between the CdS and $Cu_2S$ layers. Secondly, the presence of Zn in the $Cu_2S$ layer resulting from the topotaxy process, may cause various instability during the lifetime of the cell. When use is made of the standard evaporation or sputtering processes for the manufacture of the cells, $Cd_x Zn_y S$ structure is formed usually more or less homogenously. It is utterly difficult to limit the Zn presence only to the last 1-2 micron thickness of the CdS layer, although this is required to obtain the maximum benefit from the elimination of the mismatch between the CdS and $Cu_2S$ heterojunction structure.

In accordance with the invention, plating of just enough Zn to the surface of the CdS layer to convert the upper 1-2 micron thickness surface of said CdS layer into the required $Cd_{0.85} Zn_{0.15} S$ structure, permits to avoid the undesirable effects causing the above mentioned reduction in the short circuit current and the resulting instability caused by an excess of Zn in the $Cu_2S$ layer.

BARRIER FORMATION (STEP F)

The next step of the process according to the invention is the deposition of a thin, layer of $Cu_xS$ onto the surface of the heat-treated CdS layered substrate to produce a CdS-$Cu_xS$ wherein the value of x is from 1.996 to 2 layered assembly. This deposition is preferably carried out in a separate, $N_2$ filled adjacent room in which the finished CdS substrate must be transported. Since, during the barrier formation, a considerable amount of water vapor is generated, it is compulsory that the ambient atmosphere be permanently dried using an appropriate equipment. The barrier formation can be made using a "wet" methodology or a "dry" methodology. Both of these methodologies are standard and well known in the art and no invention is claimed therefore.

As shown in the accompanying flow chart, the $Cu_2S$ layer can be formed by dipping the CdS-layered substrate into a 10% HCl etching solution for about 5 seconds. After having been rinsed in deionized water held at 95° C., the CdS-layered substrate.may be dipped into a cuprous ion solution held at 95° C. for 1 to 5 seconds. The CdS-$Cu_xS$ layered assembly is then rinsed with deionized water held at room temperature before being carefully dried and, if necessary, cut into pieces and conveyed to a next room held under a carefully monitored dried $N_2$ ambient atmosphere with a dust filter for 1 micron particle.

HEAT TREATMENT IN THE PRESENCE OF CaO UNDER $H_2$ ATMOSPHERE (STEP G)

According to the present invention, it is compulsory to subject the CdS-$Cu_xS$ layered assembly prepared as described hereinabove (or prepared according to any other known process) to heat-treatment under $H_2$ atmosphere in the presence of CaO to substantially improve the efficiency and the stability of the resulting solar cell.

It is conventional in this field to subject to heat-treatment the CdS-Cu$_x$S solar cells at about 200° C. for a few minutes under ambient atmosphere to improve the efficiency of the resulting cells. Indeed, it is already scientifically well known that such a heat-treatment carried out in the presence of oxygen is essential for improving the operation of the cell. It is also well known in this field that a heat-treatment must be subsequently carried in the presence of a H$_2$ reducing atmosphere. The purpose of using such a H$_2$ reducing atmosphere is to extract the surplus of sulfur from the Cu$_x$S layer which, in practice, is composed of a mixture of many Cu$_x$S phases including diurleite, digenite, covellite, anilite and calcocite. For a maximum conversion efficiency, the structure of the Cu$_x$S layer must be mainly composed of Cu$_{1.995}$S, which structure can only be obtained by subjecting the CdS-Cu$_x$S solar cells to heat-treatment under the reducing atmosphere.

Up to now, this kind of heat-treatment has proved to be very expensive, since it requires the use of flowing UHP H$_2$ gas for at least 150 hours. This is one of the major reasons which have delayed so much the development and commercialization of CdS-Cu$_2$S solar cells.

In accordance with the present invention, the above mentioned heat-treatment under a H$_2$ reducing atmosphere is advantageously carried out at a temperature less than 170° C. for a substantially shorter period of time in the presence of previously desiccated CaO in a sufficient amount to absorb the sulphur formed during the heat-treatment, to retain sulfur in the form of CaS and to trap any moisture present in the cell structure.

To do so, CaO in the shape of particles, dust or coarse pieces of a lab grade, may be placed into a box furnace in which the heat-treatment is carried out. The amount of CaO must be sufficient to provide enough surface to absorb the forming sulphur efficiently and to retain the free sulfur in the form of CaS(CaO thus acting as sulfur scavenger). During the treatment, the oxygen exchanges with the constantly generated sulfur and mixes with the H$_2$ gas to produce H$_2$O in gas form which in turn reacts with Cu$_x$S to provide one or more Cu$_2$O monolayer at the surface of the Cu$_2$S (chalcosite) structure, which Cu$_2$O monolayer is essential for a proper cell operation and long term life span.

Thus, the presence of CaO ensures the availability of required oxygen to create the required monolayer of Cu$_2$O onto the surface of the cell structure without formation of an excess of moisture which is usually unavoidable when the treatment is carried out under ambient air, as it has been done up to now. This way of proceeding has the advantage of drastically reducing or completely eliminating the presence of moisture into the cell structure.

Of course, this process can be properly carried out only if the CdS-Cu$_x$S layered assembly introduced into the box furnace has been held in dried N$_2$ atmosphere prior to being heat-treated. This process can also be properly carried out only if CaO has been previously carefully desiccated by heating before being charged into the furnace.

The heat treatment can be carried out for an undetermined number of 12 hours cycle periods, depending on the condition for maximum conversion efficiency. Each heat treatment must not however exceed more than 12 hours. Moreover, it is compulsory that the heat-treatment be carried out at temperatures lower than 170° C. and preferably between 150° and 170° C. Indeed, any heating over 170° C. may greatly affect the structure of the resulting cell.

COMPLETION OF THE CELL (STEP H)

After the above mentioned heat-treatment, an upper conductor must be provided onto the upper surface of the heat-treated assembly to complete the desired, stable CdS-Cu$_x$S solar cell. The upper conductor may be applied by screen-printing an array made from a mixture of a conducting metal, preferably silver or nickel, with an epoxy resin. During the deposition, care must be taken to avoid moisture contamination, which can be harmful for a proper cell operation.

After deposition of the upper conductor by screen printing, which deposition is rather conventional in thick film methodology, the cells are subjected to drying, preferably for 15 minutes at 95° C. under carefully monitored, dried N$_2$ atmosphere. This drying can be carried out in a normal belt furnace in which dried N$_2$ gas is supplied to provide for the requested dried atmosphere condition.

After drying, the cells may been introduced again into a box surface for another heat-treatment in the presence of CaO and the presence of H$_2$ gas. This heat treatment can be carried out as described previously, for one or more cycles of 12 hours, in order to reduce as much as possible the presence of moisture that is known to substantially affect the efficienty of the cells.

ENCAPSULATION (STEP I)

As soon as the above mentioned heat treatment is completed, the final encapsulation procedure is carried out. This encapsulation procedure is very conventional. It usually comprises the step of covering the cell surfaces with clear epoxy such as EPOTEC 201 (trademark). The cell with its surfaces covered with epoxy, is then placed between preheated precut glass sheets and the sandwich structure is pressed to cause the glass sheets to glue onto the surfaces of the cell. The temperature of the glass sheets may of course vary depending on the conditions and requirements.

The resulting cells are then ready to be used after suitable curing lamination at 95° C. for about 5 minutes.

Obviously, the encapsulation step must be carried out under monitored dry inert ambient atmosphere at room temperature.

Of course, before and after lamination, any kind of testing steps may carry out as shown in the accompanying flow chart.

The process according to the invention is particularly interesting in that it is easy to carry out with a very simple equipment.

Due to the very specific selection of each of its steps, the process according to the invention permits to manufacture high efficiency, stable CdS-Cu$_x$S solar cells at low cost. The various plating and low temperature curing treatments used in accordance with the present invention are easily comparable from an economical standpoint, to the similar treatments used for the manufacture of the same kind of solar cells according to the known high vacuum evaporation technology. The fluoroborate baths uniformly used both for the cadmium and zinc deposition are very stable and require no particular attention or maintenance. Actually, the only material which needs to be replaced are the zinc and cadmium electrodes used for supplying the required metal ions in the baths. The advantage of using such baths is that the deposited layers during the various plating processes may be as low as 1 to 2 micron thick and that the deposition may be carried out under very economical conditions at room temperature. Moreover, the deposition time is very short (less than 10 seconds) thereby improving the production. Both the doctor-blading and screen-printing technologies that may be used for applying the CdS slurry onto the substrate are also very economical processes. Indeed, this kind of deposition requires conventional equipment and personel much less qualified as the scientists and highly trained solid state technicians usually required for high vacuum technology deposition.

In this connection, it should be noted that the use of a screen printing technology for the application of a slurry onto a metal substrate is new per se. The process according to the invention is actually the only process known by the inventors, which permits to manufacture successful solar cells screen-printed on metal substrates.

As foresaid, the process according to the present invention was successfully tested by the inventors. Solar cells having a high absorbing coefficient around 5000 Å, Voc in the order of 0.5 volts and Isc in the order of 20 mA/cm$^2$ with a practical mean conversion efficiency of 9 % were produced with consistent over 99 % yield in a very fast and easy manner. The reproducibility of the parameters was excellent with almost no maintenance. During the entire research period the inventors used 5 cm width copper ribbons having various thickness. The feasibility to use aluminum substrates in the form of the commercially available household (Alcan) foils was thoroughly investigated. The so produced solar cells have proved to be very stable and efficient in use.

Although reference has been made to Cu$_2$S-CdS solar cells only, the above mentioned process can be used for the manufacture of other kinds of similar II-VI class semiconductor based cells. Thus, by way of examples, the above-mentioned process was also used by the inventors for the manufacture of CdS-CdTe solar cells. In this case, 1 1-5 microns thick carbon layer (Acheson Co, Aquadag) was screen printed onto a Zn-coated copper substrate. This step was followed by the deposition of a CdTe slurry. The deposited slurry was dried and pressed and subsequently doped with Cs in a hot (95° C.) CsCl bath at pH 3. To do so, 10 gramms of CsCl (white) powder per liter of deionised water were used. After washing-up in deionised water for 5 seconds, the doped CdTe-covered substrate was heat treated at 300° C. in a box furnace under inert atmosphere for 4 hours. Over the CdTe layer, a 0.8-1 micron thick CdS doped in the already described manner was deposited. After successive heat treatment and pressing under an inert atmosphere at 400° C. (the procedure is identical with the one already described), the cells were cooled to room temperature. Over the completed cells, a transparent conductor composed by Niobium-epoxy paste was screened. After having carried out a curing and heat-treatment procedure as disclosed hereinabove, the cell was covered by transparent epoxy. The so prepared solar cells prepared with 99% yield were tested and gave over 9% conversion efficiency with 0.62 Voc and 24 mA. Isc. under Am 1 direct solar illumination.

We claim :

1. A process of manufacturing a high-efficiency, stable CdS-Cu$_2$S solar cell using a thick film methodology, said process comprising the steps of:

A—preparing a CdS slurry from a Cd-doped, CdS powder;
B—depositing a 10-15 μ thick layer of the CdS slurry onto a substrate plated with thin layers of Zn and Cd;
C—drying the CdS layered substrate and subjecting it to heat treatment;
D—pressing the heat-treated substrate;
E—subjecting the pressed, CdS layered substrate to another heat treatment to cause CdS recrystallisation and annealing;
F—forming a thin, layer of Cu$_x$S wherein the value of x is from 1.996 to 2 onto the surface of the heat-treated, CdS layered substrate under an inert atmosphere to produce a CdS-Cu$_x$S layered assembly;
G—subjecting the CdS-Cu$_x$S layered assembly to heat treatment under a H$_2$ atmosphere in the presence of CaO;
H—providing an upper conductor onto the upper surface of the heat treated assembly to complete the desired, stable CdS-Cu$_2$S solar cell; and
I—encapsulating the obtained cell.

2. The process of claim 1 comprising the additional step of:
heating a given amount of CdS powder mixed with an equal amount of Cd powder under vacuum and, subsequently, under a H$_2$ atmosphere in the presence of CaO to produce the Cd-doped CdS powder used in step A.

3. The process of claim 2, wherein the CdS powder is an electrical grade CdS powder and the Cd powder consists of highly pure, microscopic Cd particles obtained by evaporation and deposition of Cd-metal bars.

4. The process of claim 2, wherein step A is carried out by mixing the doped, CdS powder produced by heating, with α-terpineol.

5. The process of claim 4, comprising the additional, step of:
filtering the doped CdS powder at a desired particle size before mixing it with α-terpineol.

6. The process of claim 1, wherein the substrate used in step B is made of a metal selected from the group consisting of Cu, Fe and Al.

7. The process of claim 6, wherein the substrate is electroplated with a 1-2 μ thick layer of Zn in a standard high speed fluoroborate plating bath.

8. The process of claim 7, wherein the Zn-plated substrate is additionally electro plated with a 1-2 μ thick layer of Cd in a standard high speed fluoroborate plating bath before the CdS slurry is deposited.

9. The process of claim 8, wherein step B is carried out by screen printing or doctor blading under an inert atmosphere previously filtered against dust particles of more than 0.05 μ.

10. The process of claim 9, wherein drying in step C is carried out at 150° C. for 3 minutes.

11. The process of claim 10, wherein the heat treatment of step C is carried out at 400° C. for 5 minutes.

12. The process of claim 11, wherein the pressing of step D is carried out under a momentary 5-6 ton/cm$^2$ pressure.

13. The process of claim 12, wherein the pressing of step D is carried out between two chromium plated, high strength steel plates.

14. The process of claim 1, wherein the heat treatment of step E is carried out at 300° C. to 700° C. for 1 to 2 hours under inert atmosphere.

15. The process of claim 14, wherein the heat treatment of step E is carried out in a box furnace under an argon atmosphere in the presence of Cd metal to plate the heat treated substrate with a 0.5–0.10 μ thick layer of Cd.

16. The process of claim 14, wherein the heat treatment of step E is carried out in a belt furnace and the heat treated substrate is subsequently plated with a 0.5–0.1 μ thick layer of Cd by electroplating carried out in a standard high speed fluoroborate plating bath.

17. The process of claim 15, wherein the Cd-plated CdS-layered substrate is successively electroplated with a 0.3–0.4 μ thick layer of Zn in a standard high speed fluoroborate plating bath, rinsed dried and heat-treated at about 500 to 700° C. under an inert atmosphere before being used in step F.

18. The process of claim 16, wherein the CdS-layer substrate is rinsed, dried and heat-treated at 500°–700° C. under an inert atmosphere and, thereafter, successively electroplated with a 0.3–0.4 μ thick layer of Zn in a standard high speed fluoroborate plating bath, rinsed, dried and heat-treated again at about 500° to 700° C. under an inert atmosphere before being used in step F.

19. The process of claim 1, wherein the production of CdS-$Cu_xS$ layered assembly in step F is carried out under a dried atmosphere and the so produced layered assembly are carefully dried before being subjected to the heat-treatment of step G.

20. The process of claim 19, wherein the heat-treatment of step G is carried out at a temperature lower than 170° C. for less than 24 hours.

21. The process of claim 20, wherein the heat treatment of step G is carried out at 150°–170° C. for at least one period of 12 hours with presence of previously desiccated CaO in a sufficient amount to absorb the $H_2S$ formed during the heat-treatment, to retain sulfur in the form of CaS and to trap any moisture present in the cell structure.

22. The process of claim 1, wherein step H is carried out by screen-printing an array of epoxy metal paste onto the upper surface of the $Cu_xS$ layer of the cell.

23. The process of claim 22, wherein the metal contained in the epoxy metal paste is selected from the group consisting of silver and nickel.

24. The process of claim 23, wherein the screen-printed cell is dried for about 15 minutes at about 95° C. under a carefully monitored, dry inert atmosphere.

25. The process of claim 24, comprising the additional step of:
subjecting the dried cell to another heat-treat ment under a $H_2$ atmosphere in the presence of CaO for at least one period of 12 hours.

26. The process of claim 1, wherein the substrate is in a continuous ribbon form and the process is carried out in a continuous manner.

27. The process of claim 1, comprising the step of :
A—preparing a CdS slurry by mixing α-terpineol with a Cd-doped CdS powder previously obtained by heating a given amount of electrical grade CdS powder mixed with an equal amount of pure, microscopic Cd powder under vacuum and subsequently under a $H_2$ atmosphere in the presence of CaO;
B—depositing a 10–15 μ thick layer of the CdS slurry prepared in step A onto a substrate made from a metal selected from the group of consisting Cu, Fe and Al, said substrate being previously electroplated successively with a 1–2 μ thick layer of Zn and with a 1–2 μ thick layer of Cd;
C—drying the CdS layered substrate of step B at 150° C. for 3 minutes and subjecting the so-dried substrated to heat treatment at 400° C. for 5 minutes;
D—pressing the heat treated substrate of step C under a momentary 5–6 ton/$cm^2$ pressure;
E—subjecting the pressed, CdS layered substrate to another heat-treatment at 300° C. to 700° C. for 1 to 2 hours under inert atmosphere to cause CdS recrystallisation and annealing, and subsequently applying a 0.5–0.10 μ thick layer of Cd and a 0.3–0.4 μ thick layer of Zn successively onto the surface of the heat-treated substrate;
F—forming a thin, layer of $Cu_xS$ wherein the value of x is from 1.996 to 2 onto the surface of the heat-treated, CdS layered substrate under an inert atmosphere to produce a CdS-$Cu_xS$ layered assembly, and carefully drying the so produced assembly;
G—subjecting the CdS-$Cu_xS$ layered assembly to heat-treatment at 150°–170° C. for at least one period of 12 hours under a $H_2$ atmosphere in the presence of previously desiccated CaO in a sufficient amount to absorb the $H_2S$ formed during the heat treatment, to retain sulfur in the form of CaS and to trap any moisture present in the cell structure;
H—providing an upper conductor to the cell by screen-printing an array of epoxy silver or nickel paste onto the upper surface of the $Cu_2S$ layer of the cell, drying the so printed paste for 15 minutes at about 95° C. under a dry inert atmosphere and subjecting the dried cell to heat treatment under a $H_2$ atmosphere in the presence of CaO for at least one period of 12 hours; and
I—encapsulating the so obtained cell under carefully monitored dry inert atmosphere.

28. In a process of manufacturing a high-efficiency, stable CdS-$Cu_2S$ solar cell, said process comprising the steps of depositing a CdS layer onto a substrate and subsequently forming a $Cu_xS$ layer wherein the value of x is from 1.996 to 2.00 onto the surface of the CdS-layered substrate to produce the desired solar cell, the improvement comprising the additional step of subjecting the so produced solar cell to heat-treatment at 150°–170° C. under a $H_2$ atmosphere for at least one period of 12 hours in the presence of previously dessiccated CaO in a sufficient amount to absorb the $H_2S$ formed during the heat treatment, to retain sulfur in the form of CaS and to trap any moisture present in the cell structure.

29. A high-efficiency stable CdS-$Cu_2S$ solar cell obtained by the process of claim 27.

30. A process of manufacturing a high-efficiency stable II-IV class solar cell using a thick film methodology, said process comprising the steps of:
A—preparing a slurry of a II-IV class semi-conductor from a II-IV class semi-conductor powder doped to be of low resistivity;
B—depositing a 10–15 μ thick layer of the semi-conductor slurry onto a plated substrate;
C—drying semi-conductor layered substrate and subjecting it to heat treatment;
D—pressing the heat-treated substrate;
E—subjecting the pressed, semi-conductor layered substrate to another heat treatment to cause recrystallisation and annealing of the semi-conductor layer;

F—forming a thin, layer of another barrier-forming semi-conductor onto the surface of the heat-treated, II–IV class semi-conductor layered substrate under an inert atmosphere to produce a barriered, layered assembly;

G—subjecting the layered assembly to heat treatment under a $H_2$ atmosphere in the presence of CaO;

H—providing an upper conductor onto the upper surface of the heat treated assembly to complete the desired, stable solar cell; and I—encapsulating the obtained cell.

* * * * *